Figure 1:
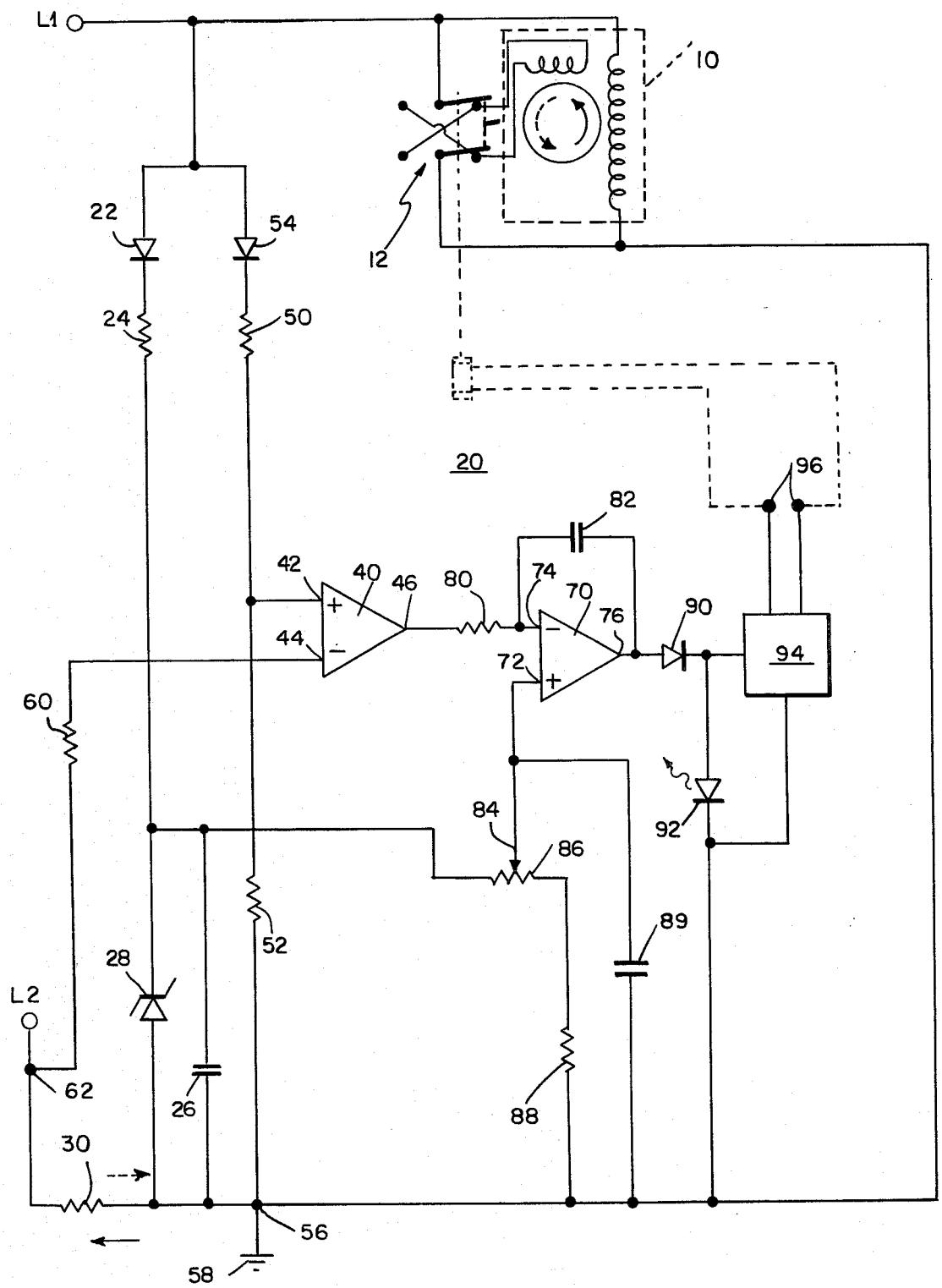

United States Patent [19]

Penn et al.

[11] 4,451,823

[45] May 29, 1984

[54] OVERLOAD SENSING CIRCUIT FOR A MOTOR

[75] Inventors: Paul E. Penn; John W. Waymire, both of Indianapolis, Ind.

[73] Assignee: Dart Controls, Inc., Zionsville, Ind.

[21] Appl. No.: 290,817

[22] Filed: Aug. 7, 1981

[51] Int. Cl.³ .............................................. G08B 21/00
[52] U.S. Cl. ................................... 340/648; 340/658; 361/85
[58] Field of Search ................ 340/648, 658; 318/434, 318/490; 324/83 R, 90, 158 MG, 83 D; 361/23, 30, 85

[56] References Cited

U.S. PATENT DOCUMENTS

| | | | |
|---|---|---|---|
| 3,519,910 | 7/1970 | Pfaff et al. | 361/85 |
| 3,600,657 | 8/1971 | Pfaff et al. | 361/30 |
| 4,194,145 | 3/1980 | Ritter | 361/85 |
| 4,194,178 | 3/1980 | Dumbeck | 340/648 |

*Primary Examiner*—Gerald L. Brigance
*Attorney, Agent, or Firm*—Barnes & Thornburg

[57] ABSTRACT

An overload-sensing circuit for an electric motor driven by an alternating signal comprises a supply line connecting the motor to a power source, a resistance in the supply line, and a first comparator for measuring the phase relationship between the power source voltage signal and the motor current signal. A variable resistor is employed to select a phase relationship which represents a load limit for the motor. A second comparator compares the measured phase relationship to the selected phase relationship and produces a signal representing an overload condition of the motor when the measured phase relationship generally equals the selected phase relationship.

12 Claims, 2 Drawing Figures

OVERLOAD SENSING CIRCUIT FOR A MOTOR

The present invention relates to overload-sensing devices for electric motors. More particularly, the present invention relates to an overload sensing circuit which detects and indicates an overload condition by measuring the phase angle relationship between the applied voltage and the motor current.

Various devices for sensing or detecting overload conditions of electric motors are well known in the art. Most of these conventional devices use spring-loaded or torque switches which detect overload conditions by measuring pressure or force. These devices are relatively expensive to manufacture and are generally unreliable after prolonged use due to wear of the mechanical parts which changes the calibration. Further, these mechanical devices do not provide exact detection of an overload condition because the condition of the motor must be transmitted through a mechanical linkage such as a spring or torque lever to measure force or torque. There is a need for a low-cost reliable system for detecting an overload condition of an electric motor which can provide an accurate indication of such condition.

In the operation of an AC induction motor, there are three electrical characteristics which could be used to detect the load condition of the motor. The power generated by the motor is determined by voltage, current, and the phase angle between the voltage and current signals. The effect upon these electrical characteristics when a motor is overloaded is well known. The voltage will generally remain constant with only slight variations. In an induction motor, the motor current signal lags the AC power source voltage signal by a phase angle. As the load on the motor increases, the phase angle between the motor current signal and the power source voltage signal decreases. The change in phase angle between the motor current signal and the power source voltage signal would provide an accurate indication of the load condition of the motor. The present invention includes a circuit for measuring the phase angle between the motor current signal and the power source voltage signal to detect an overload condition and produce an output signal indicative thereof which may be utilized to deactivate the motor and/or provide a warning.

One object of the present invention is to provide an overload sensing circuit for an electric motor which detects an overload condition by measuring the phase angle between the motor current and the power source voltage to produce a signal indicative of the overload condition.

Another object of the present invention is to provide an overload sensing circuit for an electric motor which is relatively inexpensive, completely electronic, and which accurately detects an overload condition of the motor.

A further object of the present invention is to provide an overload sensing circuit for an electric motor which will maintain its reliability after prolonged usage.

In a preferred embodiment of the present invention, a relatively small resistance in one of the supply lines connecting the motor to the power source and a first voltage comparator for comparing the voltage across the resistance to the power source voltage signal measure the phase relationship between the motor current signal and the power source voltage signal. The first comparator produces an output which swings between high and low voltage states. A time relationship between the states of the output represents the phase relationship. The voltage states of the output of the first comparator are averaged to produce a voltage level which changes as the phase relationship changes. A variable resistor allows a reference voltage to be selected which represents a predetermined phase relationship between the motor current and the power source voltage. A second voltage comparator compares the averaged voltage level to the reference voltage level to provide an output indicative of an overload condition.

Other features and advantages of the present invention will become apparent in view of the following detailed description of one embodiment thereof, which description should be considered in conjunction with the accompanying drawings, in which:

FIG. 1 is a schematic diagram of the overload sensing circuit of the present invention; and FIGS. 2(a)–(d) are a series of waveforms taken at various locations in the circuit of FIG. 1 for various phase relationships between motor current and power source voltage.

Referring to FIG. 1, a single or polyphase AC induction motor 10 may be either unidirectional or bidirectional, and is typically activated and deactivated by a switch 12. The motor 10 is connected to an AC power source, such as a 110 volt household outlet, by supply lines L1 and L2.

AC induction motors are typically used to drive household appliances such as dishwashers, washing machines, etc. If the load on the motor should reach a predetermined level, it may be rendered inoperative and therefore necessitate replacement. Furthermore, a motor overload condition may present a hazard.

In order to avoid motor 10 failure and reduce the hazard risk associated with an overload condition, various devices have been developed for detecting an overload condition of the motor 10. The circuit 20 of the present invention provides a simple and accurate means for sensing a motor overload condition.

Continuing to refer to FIG. 1, the overload sensing circuit 20 includes a 12 volt DC power supply which is formed by diode 22, resistor 24, capacitor 26, and Zener diode 28. Diode 22 has its anode connected to supply line L1 and its cathode connected to one side of resistor 24. The other side of resistor 24 is connected to the cathode of Zener diode 28 and to one side of capacitor 26. The other side of capacitor 26 and the anode of the Zener diode 28 are connected through a resistance 30 to the other supply line L2. Diode 22 half-wave rectifies the AC voltage signal of the power source, and capacitor 26 filters the rectified voltage signal to produce a positive DC voltage. The magnitude of the DC voltage is regulated by Zener diode 28. In the preferred embodiment, a 12 volt Zener diode 28 is used to produce a positive DC voltage of 12 volts.

The resistance 30 may be a resistor having a relatively small resistance value or may be a short length of the supply line L2 itself. As will be explained in more detail later, resistance 30 is used to sense motor 10 current. During the operation of the motor 10, a voltage will be produced across the resistance 30 by the motor 10 current flow. The resistance 30 is relatively small so that the voltage produced by the resistance 30 will also be small.

In the operation of an AC induction motor 10, the motor current will lag the AC power source voltage by what is commonly called a phase angle. The motor current and power source voltage are both sinusoidal waveforms which swing between positive and negative values during each cycle thereof. In response to the positive one-half cycle of the power source voltage, the motor current through resistance 30 flows from right to left in supply line L2, as indicated by the solid arrows in FIG. 1. Therefore, the right side of resistance 30 will be slightly more positive than the left side of resistance 30. In response to the negative one-half cycle of the power source voltage, the motor current flows from left to right through resistance 30 as indicated by the broken arrow in FIG. 1. However, the change in the direction of flow of the motor current through resistance 30 will lag behind the swing between positive and negative one-half cycles of the power source voltage by a time period generally corresponding to the phase angle between the power source voltage and the motor current. Therefore, for a time period after the positive one-half cycle of the power source voltage begins, the motor current will continue to flow from left to right in supply line L2 until the positive one-half cycle of the motor current begins. Likewise, for a time period after the negative one-half cycle of the power source voltage begins, the motor current will continue to flow from right to left in supply line L2 until the negative one-half cycle of the motor current begins. As the load on the motor 10 increases, the time period between the occurrence of the power source voltage transition through ground and the change in the direction of the motor current flow becomes less. Circuit 20 measures this change in the phase relationship between the power source voltage and motor current to detect an overload condition of the motor 10.

Circuit 20 includes a first voltage comparator 40 of a commercially available dual operational amplifier integrated circuit package such as the one manufactured by National Semiconductor Corporation and identified as LM358. The comparator 40 has a positive (+) input terminal 42, a negative (−) or reference input terminal 44, and an output terminal 46 which swings between high and low voltage states, depending upon the states of the input terminals 42, 44.

The positive (+) input terminal 42 is connected to a voltage divider network which includes resistors 50 and 52. A diode 54 has its anode connected to supply line L1 and its cathode connected to one side of resistor 50. The other side of resistor 50 is connected to input terminal 42 of the comparator 40. Resistor 52 also has one side connected to input terminal 42 of the comparator 40, and its other side connected to a point 56 to the right of resistance 30 in supply line L2, as seen in FIG. 1. As indicated at 58, point 56 is the ground reference for the circuit 20.

The negative (−) input terminal 44 of the comparator 40 is connected through a resistor 60 to the supply line at a point 62 to the left of the resistance 30, as shown in FIG. 1. Therefore, as motor current flows through resistance 30, the voltage at point 62 will either be slightly greater or less than ground (point 56) depending upon which one-half cycle of the motor current is occurring.

Circuit 20 also includes a second voltage comparator 70 of the same integrated circuit package of the first comparator 40. The second comparator 70 includes a positive (+) input terminal 72, a negative (−) input terminal 74, and an output terminal 76 which swings between high and low voltage states, depending upon the states of the input terminals 72 and 74. The negative (−) input terminal 74 of comparator 70 is connected through a resistor 80 to the output terminal 46 of the first comparator 40. Further, the input terminal 74 is connected through a feedback capacitor 82 to the output terminal 76 of the second comparator 70. As will be explained in more detail later, the combination of the comparator 70, resistor 80, and feedback capacitor 82 provides an integrator which averages the high and low voltage states of the output 46 to produce a smooth average voltage level for comparison of the input at the positive (+) input terminal 72.

The positive (+) input terminal 72 of the second comparator 70 is connected to the wiper 84 of a potentiometer 86. One side of potentiometer 86 is connected to the 12 volt DC power supply and the other side is connected through a resistor 88 to point 56. A capacitor 89 is connected in parallel with a portion of potentiometer 86 and resistor 88. The capacitor 89 assists in delaying the establishment of voltage at wiper 84 during the start-up of the circuit 20.

Output terminal 76 of the second voltage comparator 70 may be considered the output of overload-sensing circuit 20. As will be described later, when output terminal 76 is high, this is an indication that the motor 10 is overloaded. In such overload condition, it is desirable to deactivate the motor 10 or to control some other machine function to prevent failure of the motor and reduce hazardous risk. In the illustrative embodiment, the output terminal 76 is connected through a diode 90 to a light-emitting diode (LED) 92 to provide a visual indication of an overload condition. Further, the output terminal 76 is connected to a function-control circuit 94 which, for example, may include a light-sensitive triac and another light-emitting diode for turning the triac on in an overload condition. Output terminals 96 of the function-control circuit 94 may be connected to various other devices for controlling the operation of the motor 10 in response to an overload condition. For example, output terminals 96 may be connected to a solenoid which will automatically open switch 12 to deactivate the motor 10 when an overload condition is detected by circuit 20. This option is illustrated diagrammatically by the broken lines extending between terminals 96 and switch 12.

Figure 2:
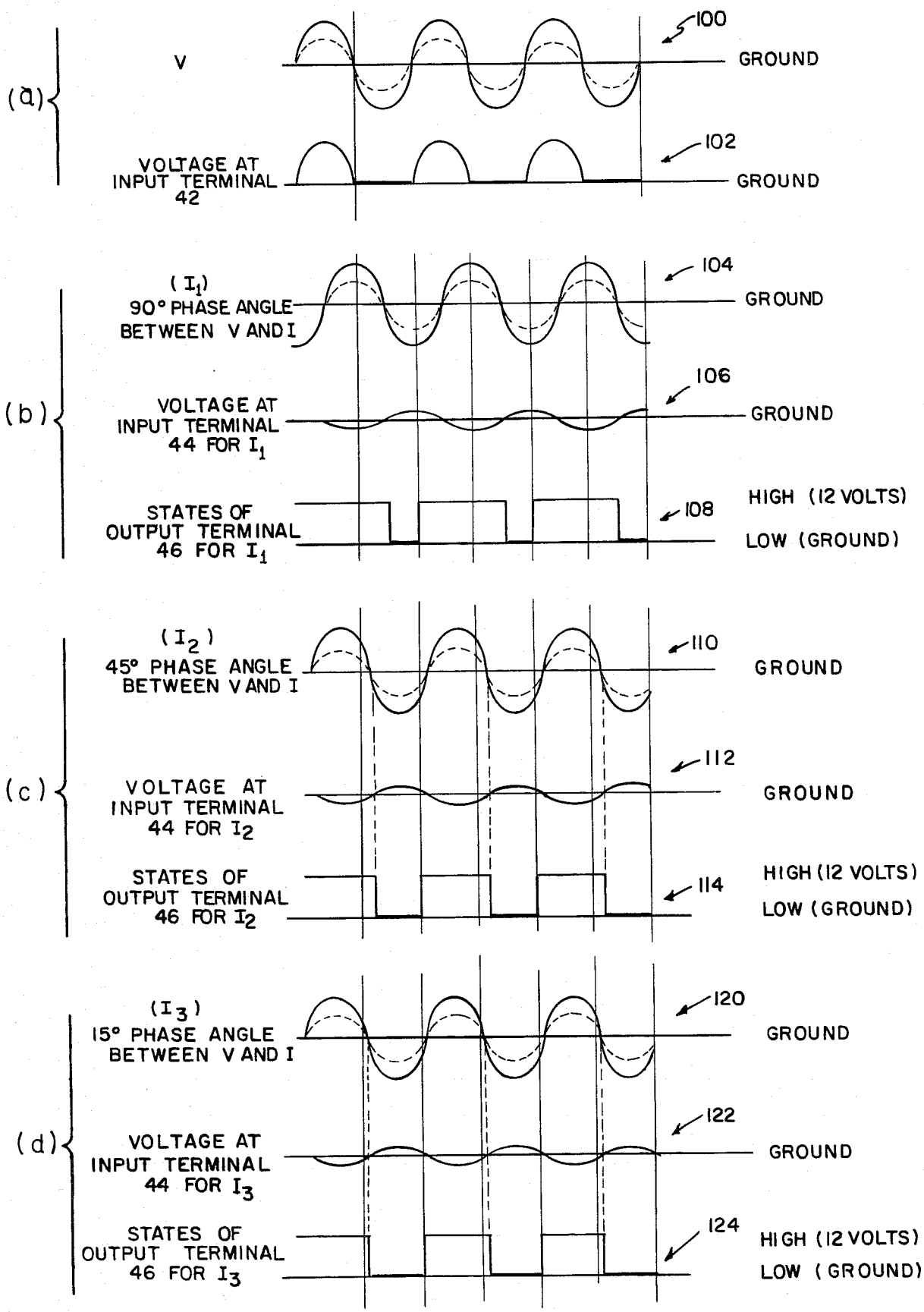

The operation of circuit 20 can best be described by referring to FIGS. 1 and 2. In FIG. 2(a), AC power source voltage (V) is represented by a sinusoidal waveform 100. The peak magnitude of the voltage (V) waveform is not important to the operation of circuit 20 since its phase angle relationship to the motor current is measured by circuit 20 to detect an overload condition. This feature is illustrated in FIG. 2(a) by the solid and broken line waveforms. During a complete 360° cycle of the voltage (V) waveform, the voltage is positive for one-half of the cycle (180°), and it is negative for the other one-half of the cycle (180°). The voltage (V) waveform 100 is half-wave rectified by diode 54 so that only the positive one-half of the cycle of the voltage (V) waveform 100 is allowed to pass through the diode 54. The other one-half cycle of the waveform 100 is clipped so that it is generally at ground, as indicated at 102 in FIG. 2(a). This half-wave rectified voltage (V) waveform 102 is divided by resistors 50, 52 and appears as an input to the positive (+) input terminal 42 of the first voltage comparator 40. In the preferred embodiment, the resistance value of resistor 52 is considerably less than the resistance value of resistor 50.

The current through the motor 10 is also represented by a sinusoidal waveform. Typically for an inductive load, such as an AC induction motor 10, the motor current (I) waveform will lag the power source voltage waveform 100 so that the voltage (V) waveform 100 swings through the ground level before the motor current (I) waveform. This lag is commonly referred to as the phase angle between the voltage (V) and current (I) waveforms, and is expressed in degrees.

When an AC induction motor 10 is operating in an unloaded condition, the motor current (I) waveform lags the voltage (V) waveform 100 by a phase angle of approximately 90°, as indicated at 104 in FIG. 2(b). As the motor 10 becomes loaded, the phase angle between the voltage (V) and current (I) waveforms 100, 104, respectively, progressively decreases. The decrease in phase angle between the voltage (V) waveform 100 and the motor current (I) is illustrated as $I_2$ at 110 in FIG. 2(c) and $I_3$ at 120 in FIG. 2(d). Therefore, by measuring changes in the phase angle relationship between the power source voltage waveform 100 and the motor current (I) waveform 104, 110, or 120 during the operation of the motor 10, an overload condition of the motor 10 can be detected. It should again be noted that the peak magnitude of the motor current is not important to the operation of circuit 20. This feature is illustrated in FIGS. 2(b), (c), and (d) by the solid and broken line waveforms.

The direction of the flow of motor current (I) through resistance 30 changes during each half-cycle of the motor current (I) waveform 104, 110, or 120. It flows in the direction of the solid arrow during the positive one-half cycle and then in the direction of the broken arrow during the negative one-half cycle, as seen in FIG. 1. However, this change in the direction of current (I) flow lags the change in voltage (V) by the phase angle therebetween. During a portion of the positive one-half cycle of voltage (V) waveform 100, the motor current (I) flows from right to left in the direction of the solid arrow in FIG. 1. For a time period during the negative one-half cycle of the voltage (V) waveform 100, the motor current (I) continues to flow through the resistance 30 from right to left. Eventually, the motor current (I) waveform 104, 110, or 120 becomes negative and flows from left to right through resistance 30, as indicated by the broken arrow in FIG. 1. The time period between when the voltage (V) waveform 100 becomes negative and the motor current (I) waveform 104, 110, 120 becomes negative represents the phase angle between the power source voltage (V) and the motor current (I). The circuit 20 measures the phase angle relationship by sensing the voltage at a point 62 to the left of the resistance 30 in FIG. 1. Since point 56 serves as the ground or reference point for the circuit 20 during the positive one-half cycle of the motor current (I) waveform 104, 110, or 120, the voltage at point 62 measured across resistance 30 will be below the ground at point 56. During the negative one-half cycle of the motor current (I) waveform 104, 110, or 120, the voltage at point 62 measured across the resistance 30 will be above ground level. The voltage sensed at point 62 appears as an input at the negative (−) input terminal 44 of comparator 40. The sensed voltage at point 62 is illustrated at 106, 112, and 122 in FIGS. 2(b), (c), and (d) for motor currents (I) have phase angles of 90°, 45°, and 15° relative to the power source voltage (V).

As long as the voltage (V) at the positive (+) input terminal 42 of the first voltage comparator 40 is greater than the sensed voltage at the negative (−) input terminal 44, the signal at the output terminal 46 will be high. In the illustrative embodiment, the voltage of this high output signal will be 12 volts. When the sensed voltage at the negative (−) input terminal 44 is equal to or greater than the voltage (V) at the positive (+) input terminal 42, the signal at the output terminal 46 is low. Therefore, as can be seen in FIGS. 2(a), (b), (c), and (d), the signal at output terminal 46 will only be low during that portion of the negative half-cycle of the voltage (V) waveform 100 when the motor current (I) waveform is also negative and the sensed voltage at point 62 is slightly above ground. The time the output 46 remains low represents the phase angle between the voltage (V) waveform 100, and the current (I) waveform. The states of the output terminal 46 for different phase angle relationships between the voltage (V) waveform 100 and the current (I) waveforms 104, 110, and 120 are indicated at 108, 114, and 124 in FIGS. 2(b), (c), and (d), respectively.

The high and low states of the output terminal 46 of first voltage comparator 40 are integrated by the combination of second voltage comparator 70, resistor 80, and capacitor 82 to provide average voltage level of the states of output terminal 46 at the negative (−) input terminal 74 of the second voltage comparator 70. Where the phase angle relationship between the voltage (V) waveform 100 and the current (I) waveform 104 is 90°, the output terminal 46 is high for three-quarters of the cycle of the voltage (V) waveform 100 and low for one-quarter of its cycle. Therefore, the average voltage level at the negative (−) input terminal 74 is 9 volts. If the phase angle between the voltage (V) and current (I) waveforms should become zero, then the output terminal 46 of comparator 40 will be high for one-half of the cycle of the voltage (V) waveform 100 and low for the other one-half of its cycle. Therefore, the average voltage level at the negative (−) input terminal 74 would be 6 volts.

The wiper 84 of potentiometer 86 is used to select a reference voltage level of somewhere between 6 and 9 volts. The reference voltage level at the positive (+) input terminal 72 of the comparator 70 should be selected so that it is somewhere between the minimum 6 volt level of the input at terminal 74 and its maximum 9 volt level. As long as the voltage level at the positive (+) input terminal 72 remains lower than the averaged voltage level at the negative (−) input terminal 74, the output terminals 76 will remain low. When the averaged voltage level at the negative (−) input terminal 74 falls below the reference voltage level at the positive (+) input terminal 72, the output terminal 76 will go high in a ramp to indicate an overload condition of the motor 10. The ramped high state of the output terminal 76 can be used to control the motor 10 or any other machine function to prevent complete failure of the motor and reduce the hazard of such condition.

What is claimed is:

1. In combination with an electric motor, an alternating signal source for driving the motor and supply lines connecting the motor to the signal source, a circuit for sensing an overload condition of the motor comprising means for providing a voltage signal indicative of changes in the motor current, means for measuring the phase relationship between the signal source voltage and the voltage signal indicative of motor current, the measuring means providing an output signal having first and second levels wherein the relative time durations of the first and second signal levels correspond to the phase relationship between the signal source voltage and the voltage signal indicative of motor current, means for selecting a reference phase relationship indicative of a load limit for the motor, and means for comparing the output signal to the reference phase relationship and for providing a signal to indicate an overload condition of the motor when the reference phase relationship is greater than the measured phase relationship.

2. The circuit of claim 1 wherein the sensing means includes a resistance in one of the supply lines to provide a voltage related to the motor current, and the measuring means includes a first voltage comparator for comparing the voltage provided by the resistance to the signal source voltage.

3. The circuit of claim 2 wherein the first voltage comparator includes first and second inputs, first means is provided for coupling the first input to the supply lines to provide the signal source voltage at the first input, second means is provided for coupling the second input to the one supply line in proximity to the resistance, the first comparator further includes an output which provides the first signal level when the first input is greater than the second input and the second signal level when the second input is greater than the first input.

4. The circuit of claim 3 wherein the first coupling means includes means for rectifying the negative one-half cycle of the signal source voltage and the second input of the first comparator is coupled to the one supply line at a selected point so that the voltage provided at the second input is inversely related to the motor current, the voltage at the second input being negative during the positive one-half cycle of the motor current and positive during the negative one-half cycle of the motor current.

5. The circuit of claim 4 wherein the selecting means includes means for setting a reference voltage level.

6. The circuit of claim 5 wherein the comparing means includes a second voltage comparator, the second voltage comparator including first and second inputs, and an output which provides the signal to indicate the overload condition.

7. The circuit of claim 6 wherein third means is provided for coupling the first input of the second comparator to the output of the first comparator and fourth means is provided for coupling the second input of the second comparator to the reference voltage level setting means.

8. The circuit of claim 7 wherein the third coupling means includes means for averaging the first and second signal levels of the output of the first comparator to provide an average voltage level at the first input of the second comparator.

9. The circuit of claim 8 wherein the output of the second comparator provides a signal to indicate the overload condition when the reference voltage level provided at the second input of the second comparator is greater than averaged voltage level provided at its first input.

10. A method of detecting an overload condition of an electric motor, comprising the steps of providing a voltage signal indicative of changes in the current in a conductor coupling the motor to an alternating signal source, measuring a phase relationship between the voltage indicative of motor current and the signal source voltage and providing an output signal that goes from a first voltage state to a second voltage state and back to the first voltage state in response thereto, the relative time durations of the first and second voltage states corresponding to the phase relationship between the signal source voltage and the voltage indicative of motor current, selecting a reference phase relationship between the sensed motor current and the signal source voltage which indicates a load limit for the motor, comparing the measured phase relationship to the reference phase relationship, and providing a signal to indicate an overload condition of the motor when the reference phase relationship is greater than the measured phase relationship.

11. An overload sensing circuit for an electric motor, comprising means for coupling the motor to an alternating signal source, means for providing a voltage signal indicative of changes in the motor current, means for measuring a phase relationship between the signal source voltage and the voltage indicative of motor current, means for coupling the measuring means to the voltage signal-providing means to provide an input to the measuring means, the measuring means having an output which changes from a first voltage state to a second voltage state and back to the first voltage state in accordance with changes in the measured phase relationship, the relative time durations of the first and second voltage states corresponding to the phase relationship between the signal source voltage and the voltage indicative of motor current, means for selecting a reference voltage indicating a load limit for the motor, and means for comparing the changing output of the measuring means to the reference voltage, the comparing means having an output which provides a signal to indicate an overload condition of the motor when the reference voltage is greater than the output of the comparing means.

12. An overload sensing circuit for a motor driven by an alternating signal power source, comprising a resistance in a supply line connecting the power source and the motor for providing a voltage waveform inversely related to the motor current waveform, first means for comparing the voltage waveform provided by the resistance to the power source voltage waveform, the first comparing means having an output which swings between high and low voltage states, the time period of the low voltage state representing the phase relationship between the power source voltage waveform and the motor current waveform, means for averaging the high and low voltage states of the output of the first comparing means to provide an averaged voltage level, the first voltage level varying in accordance with changes in the phase relationship between the power source voltage and the motor current, means for selecting a reference voltage level representing a load limit for the motor, and second means for comparing the averaged voltage level to the reference voltage level, the second comparing means having an output which provides a signal to indicate an overload condition of the motor when the reference voltage level is greater than the averaged voltage level.

* * * * *